United States Patent [19]

Nguyen et al.

[11] Patent Number: 5,597,983
[45] Date of Patent: Jan. 28, 1997

[54] PROCESS OF REMOVING POLYMERS IN SEMICONDUCTOR VIAS

[75] Inventors: Loi N. Nguyen; Yih-Shung Lin, both of Carrollton, Tex.

[73] Assignee: SGS-Thomson Microelectronics, Inc., Carrollton, Tex.

[21] Appl. No.: 371,996

[22] Filed: Jan. 12, 1995

Related U.S. Application Data

[62] Division of Ser. No. 191,770, Feb. 3, 1994.

[51] Int. Cl.$^6$ ........................................... H05K 1/00
[52] U.S. Cl. ..................... 174/264; 174/262; 174/250
[58] Field of Search ................................. 174/250, 261, 174/262, 264, 258

[56] References Cited

U.S. PATENT DOCUMENTS

| | | | |
|---|---|---|---|
| 3,507,766 | 4/1970 | Cunningham et al. | 437/164 |
| 4,346,125 | 8/1982 | Kinsbron et al. | 156/659.1 |
| 4,369,090 | 1/1983 | Wilson et al. | 156/659.1 |
| 4,606,998 | 8/1986 | Clodgo et al. | 156/650 |
| 4,857,141 | 8/1989 | Abe et al. | 156/657 |
| 4,960,491 | 10/1990 | Youlton | 156/659.1 |
| 5,037,506 | 8/1991 | Gupta et al. | 156/659.1 |
| 5,263,243 | 11/1993 | Taneda et al. | 29/830 |
| 5,451,721 | 9/1995 | Tsukada et al. | 174/261 |
| 5,455,459 | 10/1995 | Fillion et al. | 257/760 |
| 5,473,120 | 12/1995 | Ito et al. | 174/264 |

FOREIGN PATENT DOCUMENTS

| | | |
|---|---|---|
| 2625870A1 | 6/1976 | Germany . |
| 3141680A1 | 10/1981 | Germany . |
| 64002325 | 6/1982 | Japan . |
| 1219740 | 1/1989 | Japan . |

*Primary Examiner*—Laura Thomas
*Attorney, Agent, or Firm*—Theodore E. Galanthay; Kenneth C. Hill; Lisa K. Jorgenson

[57] ABSTRACT

A method for forming a contact via in an integrated circuit includes the formation of an aluminum conductive element on an integrated circuit device. A conformal insulating layer is then deposited over the device. Using a masking layer, an anisotropic etch is performed to open a via through the conformal insulating layer. During the anisotropic etch, polymers are created from the resist and etch chemistry and adhere to the sidewalls of the via. A resist developer containing Tetra Methyl Amonium Hydroxide is used to remove the polymers from the via. A contact may now be formed by depositing conductive material into the via.

5 Claims, 1 Drawing Sheet

PROCESS OF REMOVING POLYMERS IN SEMICONDUCTOR VIAS

This is a division, of application Ser. No. 08/191,770, filed Feb. 3, 1994.

BACKGROUND OF THE INVENTION

1. Field of the Invention

The present invention relates generally to semiconductor integrated circuits, and more specifically to the formation of contact vias in an integrated circuit.

2. Description of the Prior Art

In semiconductor integrated circuits, formation of interconnect layers is important to the proper operation of these devices. Interconnect signal lines make contact with lower conductive layers in the integrated circuit through vias in an insulating layer. For best operation of the device, the lower conductive layers should not be damaged during formation of the contact via.

Various interlevel insulating layers are deposited on the integrated circuit during formation of the device. These layers separate the conductive layers from each other. One method to form contact vias through these insulating layers utilizes a resist layer to define the via locations. An anisotropic etch is then performed to open the vias. During the anisotropic etch, however, polymers are created from the resist and the etch chemistry, and adhere to the sidewalls of the via. These polymers need to be removed so that proper contact is made in the via between the conductive layers.

As known in the prior art, the polymers are removed or dissolved through the use of a solvent, acid or plasma etch. During this process, however, a substantial amount of the underlying aluminum conductive layer can be removed. Additionally, the acid or plasma etch can remove some of the insulating layer, which enlarges the size of the via.

Therefore, it would be desirable to provide a technique for forming contact vias in integrated circuits without damaging the underlying conductive layers or enlarging the size of the via.

SUMMARY OF THE INVENTION

It is therefore an object of the present invention to provide a method for forming contact vias in an integrated circuit without damaging underlying conductive layers.

It is another object of the present invention to provide a method for forming contact vias wherein the shape and size of the vias are not altered.

It is another object of the present invention to provide such a method and structure which is compatible with standard process flows, and which add minimal additional complexity to the fabrication of a typical integrated circuit.

Therefore, according to the present invention a method for forming a contact via in an integrated circuit includes the formation of an aluminum conductive element on an integrated circuit device. A conformal insulating layer is then deposited over the device. Using a masking layer, an anisotropic etch is performed to open a via through the conformal insulating layer. During the anisotropic etch, polymers are created from the resist and etch chemistry and adhere to the sidewalls of the via. A resist developer containing Tetra Methyl Amonium Hydroxide is used to remove the polymers from the via. A contact may now be formed by depositing conductive material into the via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
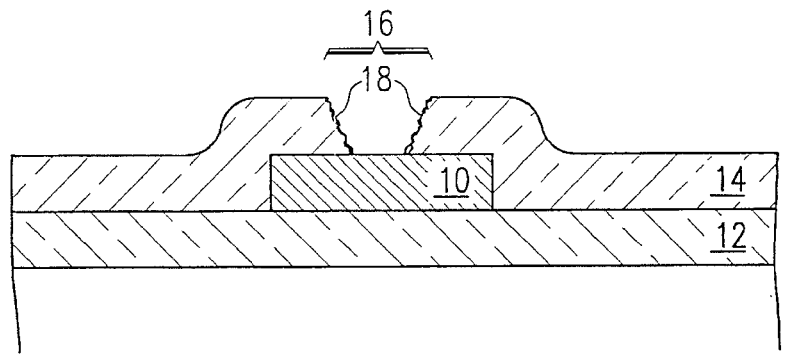
FIGS. 1 and 2 are sectional views illustrating a prior art method for forming a via in an integrated circuit.
Figure 2:
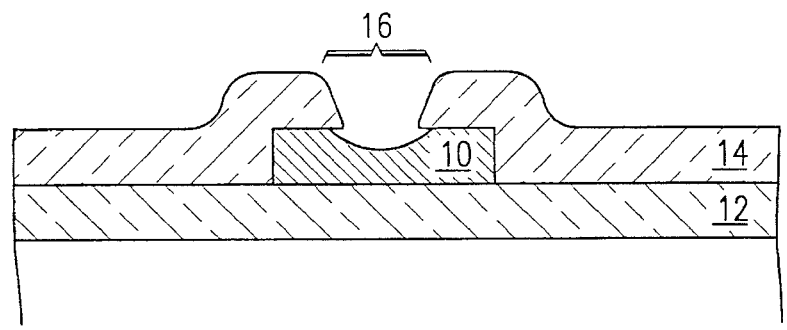

FIGS. 1 and 2 depict formation of an interlevel contact via as known in the prior art. Referring to FIG. 1, a conductive element 10 is formed on an interlevel insulating layer 12. The conductive element 10 is made from aluminum, and the insulating layer 12 may be made from oxide. A conformal insulating layer 14 of oxide is then deposited over the device. Using a masking layer (not shown), an anisotropic etch is performed to open a via 16 through the conformal insulating layer 14. During the anisotropic etch, polymers 18 are formed from the resist and etch chemistry. These polymers 18 adhere to the sidewalls of the via 16.

FIG. 2 illustrates the via after the polymers 18 have been removed. Typically, a plasma etch or a solvent known in the art as piranha, which contains a mixture of hydrogen peroxide and sulfuric acid, is used to remove the polymers 18. One skilled in the art will recognize that piranha will not damage an underlying conductive layer made from polycrystalline silicon. If, however, the underlying conductive layer is made from aluminum, a refractory metal, or a silicided poly, piranha will etch into the material, and can remove a substantial amount of the layer. Thus, the acid used to remove the polymers 18 creates undesirable holes in the aluminum.

If a plasma etch is used to remove the polymers 18, undesirable holes can also be formed in the aluminum due to the overetching required to ensure complete removal of the polymers 18. If the etch is not performed long enough, some of the polymers 18 will not be removed. Thus, a plasma etch presents a trade off. Either holes are formed in the aluminum or not all of the polymers 18 are removed.

Another problem encountered with this method is the plasma etch or acid also removes some of the conformal insulating layer 14. This increases the size of the via 16, and smooths out the sidewalls of the via 16. Increasing the size of the via 16 can ultimately result in decreasing the total number of components that can be built on the integrated circuit.

Figure 3:
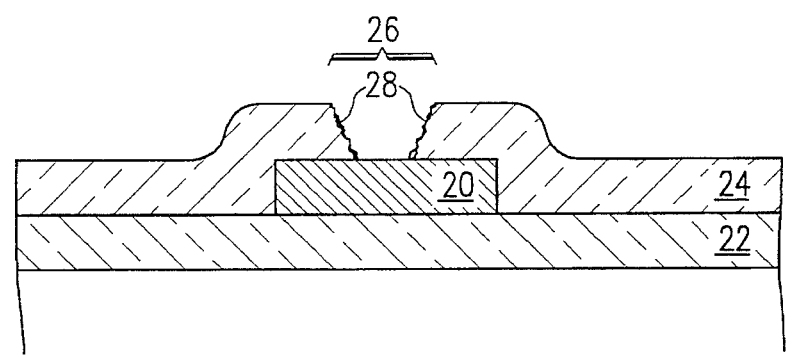
FIGS. 3–5 are sectional views illustrating the preferred method for forming a via in an integrated circuit according to the present invention.
Figure 4:
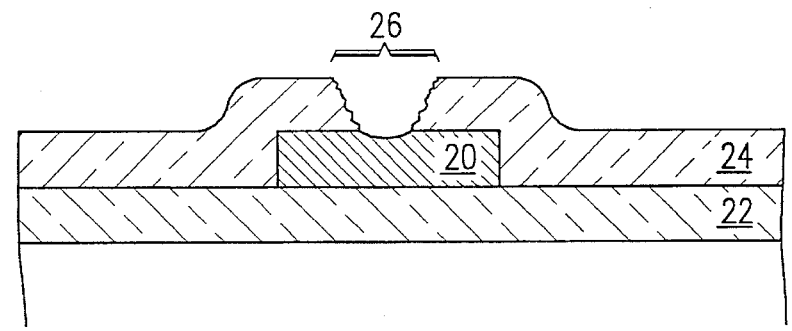
Figure 5:
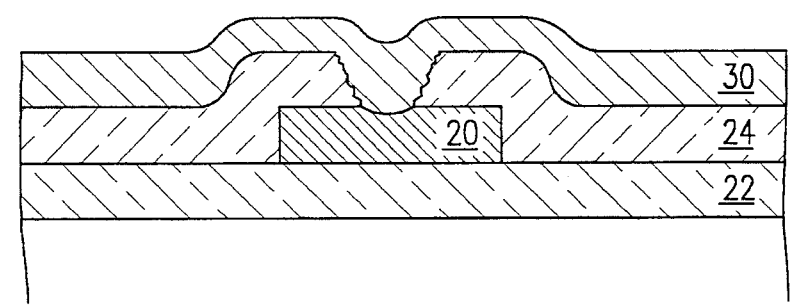

FIGS. 3–5 illustrate the formation of vias according to the present invention. Referring to FIG. 3, a conductive element 20 is formed on an interlevel insulating layer 22. A conformal insulating layer 24 is deposited over the device. The conductive element 20 is made from aluminum, and the insulating layers may be made from oxide. Using a masking layer (not shown), an anisotropic etch is performed to open a via 26 in the conformal insulating layer 24. During the anisotropic etch, polymers 28 are formed from the resist and etch chemistry. These polymers 28 adhere to the sidewalls of the via 26.

FIG. 4 illustrates a device after the polymers 28 have been removed. A resist developer containing Tetra Methyl Amonium Hydroxide (TMAH) is used to remove the polymers 28 in the via 26. One resist developer which can be used, for example, is sold under the brand name of Microposit Developer S-319, and is manufactured by Shipley Co., Inc. By using a resist developer containing TMAH, the size and sidewalls of the via are not affected. Thus, via does not enlarge, and sidewalls are left rough. Additionally, a relatively small portion of the aluminum is removed.

Referring to FIG. 5, a conductive layer 30 is deposited over the device and extends into the via 26, forming a conductive contact between the aluminum and the conductive layer 30. The integrated circuit is now ready for further processing using techniques which are known in the art.

It will be appreciated by those skilled in the art, the techniques described above create vias without removing a substantial amount of aluminum. Additionally, the resist developer used to remove the polymers does not etch oxide, thereby maintaining the desired size of the via.

While the invention has been particularly shown and described with reference to a preferred embodiment, it will be understood by those skilled in the art that various changes in form and detail may be made therein without departing from the spirit and scope of the invention.

What is claimed is:

1. A structure in an integrated circuit comprising:

a first metal conductive element in an integrated circuit;

a silicon oxide layer deposited over the conductive element;

a via through the silicon oxide layer, wherein the sidewalls of the via are relatively rough, having a surface roughness characteristic of not having been exposed to either an wet or a cleanup plasma etch, and an upper surface of the first metal conductive element exposed in the via has a relatively small dip therein; and a second metal conductive element over the device and extending into the via, wherein a conductive contact is made between the second metal conductive element and the first metal conductive element.

2. The structure of claim 1, wherein said first metal conductive element comprises aluminum.

3. The structure of claim 2, wherein said first metal conductive element comprises a refractory metal.

4. The structure of claim 1, wherein the surface roughness of the via sidewalls is the result of:

forming the silicon oxide layer over the first metal conductive element;

forming and patterning a resist layer over the silicon oxide layer to define a via location;

anisotropically etching the silicon oxide layer to form a via at the via location, wherein contaminate particles containing a polymer are formed on the sidewalls of the via; and removing the contaminate particles with a chemical that acts as a developer for the resist.

5. The structure of claim 4, wherein TMAH is used to remove the contaminate particles.

* * * * *